United States Patent [19]

Ono et al.

[11] Patent Number: 5,294,560

[45] Date of Patent: Mar. 15, 1994

[54] BIDIRECTIONAL NONLINEAR RESISTOR, ACTIVE MATRIX LIQUID CRYSTAL PANEL USING BIDIRECTIONAL NONLINEAR RESISTOR, AND METHOD FOR PRODUCTION THEREOF

[75] Inventors: Yoshihiro Ono; Fumiaki Matsushima; Kuniyasu Matsui, all of Suwa; Tetsuya Osaka, Tanashi, all of Japan

[73] Assignee: Seiko Epson Corporation, Tokyo, Japan

[21] Appl. No.: 674,855

[22] Filed: Mar. 26, 1991

Related U.S. Application Data

[63] Continuation-in-part of Ser. No. 463,761, Jan. 12, 1990, Pat. No. 5,175,114.

[30] Foreign Application Priority Data

| Jan. 13, 1989 | [JP] | Japan | 1-6446 |
| Apr. 4, 1989 | [JP] | Japan | 1-85371 |
| Apr. 4, 1989 | [JP] | Japan | 1-85372 |
| Apr. 4, 1989 | [JP] | Japan | 1-85373 |
| Apr. 4, 1989 | [JP] | Japan | 1-85374 |
| Nov. 6, 1989 | [JP] | Japan | 1-288402 |
| Mar. 27, 1990 | [JP] | Japan | 2-78509 |

[51] Int. Cl.⁵ .......................... H01L 21/47
[52] U.S. Cl. .......................... 437/47; 437/60; 437/228; 437/235; 437/918; 148/DIG. 136
[58] Field of Search .............. 437/47, 60, 918, 228, 437/235; 148/DIG. 136

[56] References Cited

U.S. PATENT DOCUMENTS 3,303,357 2/1967 White .......................... 307/88.5
3,655,543 4/1972 Dijkstra et al. .......................... 209/181

FOREIGN PATENT DOCUMENTS 381927 8/1990 European Pat. Off. .
1252335 10/1967 Fed. Rep. of Germany .
2013259 3/1990 France .
55-93251 7/1980 Japan .......................... 437/918
59-178669 2/1984 Japan .
59-63760 4/1984 Japan .
60-241021 11/1985 Japan .
61-163659 7/1986 Japan .
1-109328 4/1989 Japan .

OTHER PUBLICATIONS

Summary of Report presented at Prof. Osaka's seminar of Waseda University (Feb. 1990).

Murthy, et al., "preparation of polypyrrole in aqueous media", J. of Materials Science Letters, 3 (1984) pp. 745–747.

Morozumi, S. and Ohta, T., "A 9-inch MIM-LCD," vol. 40, No. 10, pp. 980(46)–983(49), (1986).

Primary Examiner—Olik Chaudhuri
Assistant Examiner—Ourmazd S. Ojan
Attorney, Agent, or Firm—Blum Kaplan

[57] ABSTRACT

A bidirectional nonlinear resistor for use as a nonlinear active element having a highly insulating organic film formed on a first conductor by polymerizing in an electrolytic solution containing a supporting electrolyte and a soluble organic compound, and a second conductor identical or not identical in kind with the first conductor formed on the organic film is provided. An active matrix substrate including a plurality of the bidirectional nonlinear resistor elements may be used to have a liquid crystal display panel. In a preferred embodiment, the electrolytic solution includes an alkali hydroxide as a supporting electrolyte so that dopant need not be removed after formation of the film. The electrolytic solution which is electrolytically polymerized to form the insulating organic film includes a monomer, preferably pyrrole, pyrrole derivatives, phenol or phenol derivatives, dissolved in an electrolytic solution.

19 Claims, 10 Drawing Sheets

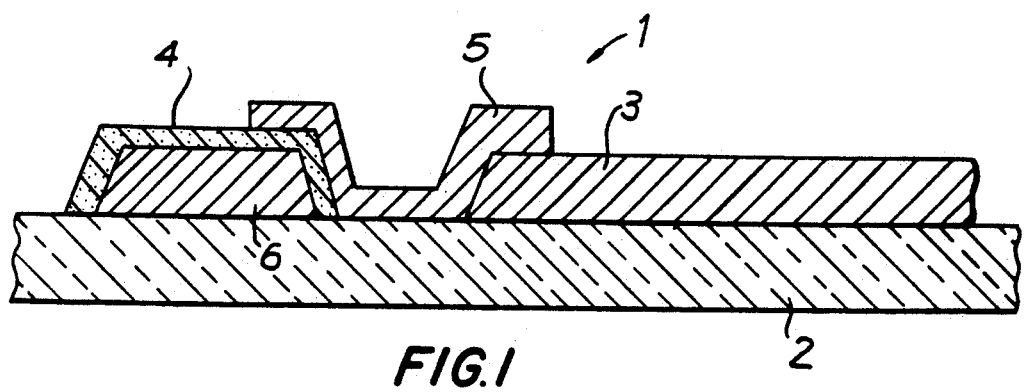
FIG.1
PRIOR ART
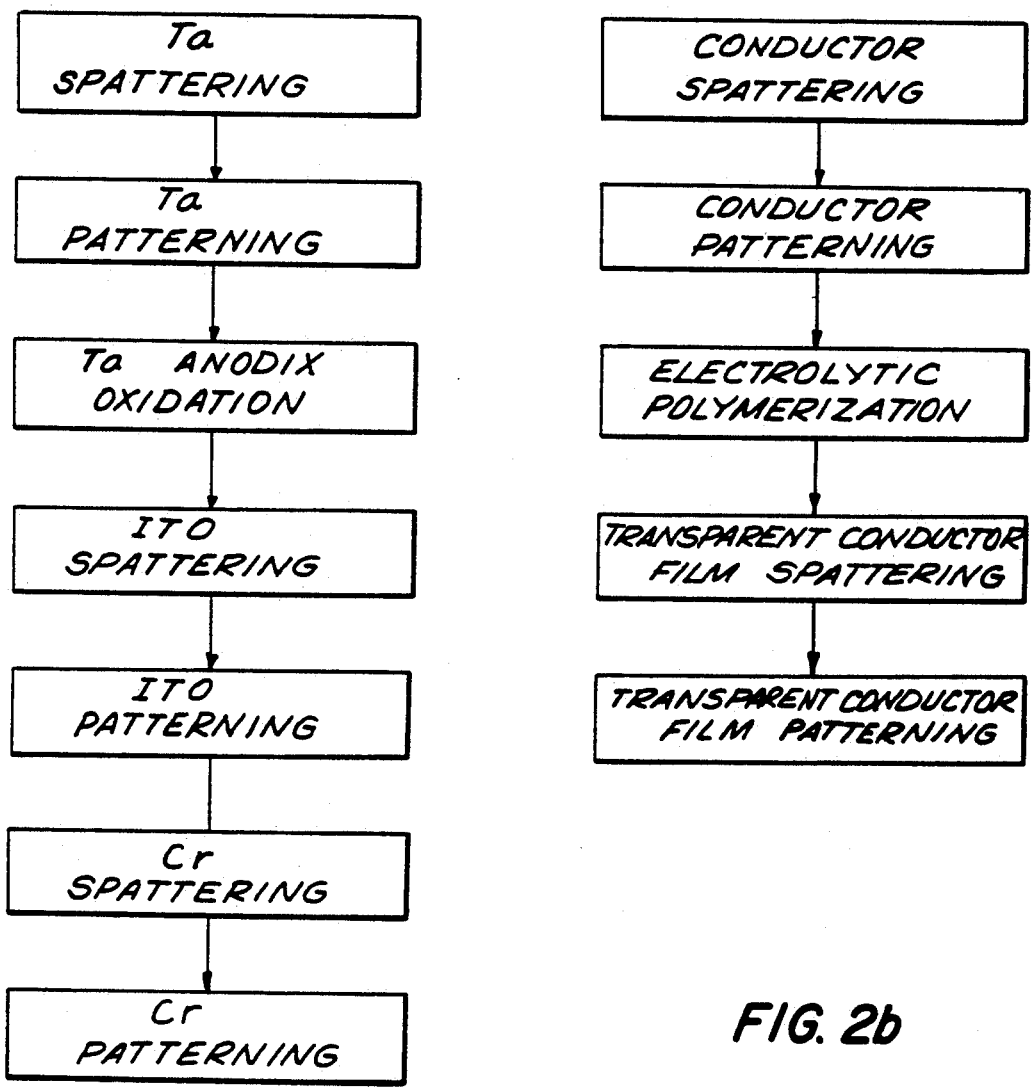
FIG. 2a PRIOR ART
FIG. 2b

BIDIRECTIONAL NONLINEAR RESISTOR, ACTIVE MATRIX LIQUID CRYSTAL PANEL USING BIDIRECTIONAL NONLINEAR RESISTOR, AND METHOD FOR PRODUCTION THEREOF

CROSS REFERENCE TO RELATED APPLICATION

This is a continuation-in-part of copending application Ser. No. 07/463,761, filed Jan. 12, 1990, now U.S. Pat. No. 5,175,114.

BACKGROUND OF THE INVENTION

This invention relates to a nonlinear resistor for all elements which require nonlinearity of resistance, and in particular, to a nonlinear resistor useful as an MIM (metal-insulator-metal) element functioning as a switching element in liquid crystal display devices, computer grade display devices or TV grade liquid crystal display devices.

The methods currently used for display of pictures in electro-optical displays, such as liquid crystal televisions are broadly classified as the simple matrix method and the active matrix method. The simple matrix method includes a liquid crystal interposed between two opposed, perpendicularly-intersecting sets of multiple ribbon-like electrodes. A drive circuit is connected to each of the ribbon-like electrodes. While the simple structure makes this method inexpensive, the resulting picture contrast is insufficient because of cross talk.

In contrast, the active matrix method utilizes switches which are adapted severally to serve individual picture elements and thus permits voltage retention. Because the selected voltage is retained even during the course of timeshared driving, the resulting large display capacity allows excellent picture qualities such as contrast. The active matrix method nevertheless has a complicated structure and so the production cost is high. For example, in manufacturing thin film transistors (TFTs), using at least five photomasks to improve the yield for superposing five or six thin films is difficult. Accordingly, the two-terminal elements which allow improved yield and reduce production costs have been used in favor of other active elements.

The metal-insulator-metal element (MIM) is representative of these two-terminal elements. The general structure and process for fabricating the MIM devices are shown in FIG. 1 and FIG. 2. The insulating films in conventional MIM elements have a lower electrode of $TaO_x$ formed by anodic oxidation. Since the specific dielectric constant is about 26, the element capacitance is as high as 0.1 pF when the size of the element is approximately 5 $\mu m \times 4$ $\mu m$ and the anodic oxide film thickness is approximately 600 Å. This element capacitance is as large as about ⅓ of the liquid crystal capacitance per picture element (200×200 $\mu m$).

Conventional MIM elements and the method of manufacture have three disadvantages. First, in a liquid crystal panel of this quality, voltages applied to the panel are not fully apportioned to the MIM element. Consequently, the switching property is inferior since the capacity ratio of the capacitance of the liquid crystal to the MIM element is about 3. As the result, the liquid crystal panel is inferior in display quality to the TFT panel.

The second disadvantage is that the MIM element side substrate is produced by a repeated photolithoetching step, as noted in the process flow sheet of FIG. 2. While this repetition step simplifies the production process of the MIM element as compared with that of the TFT element, it nevertheless reduces the resulting yield.

The third disadvantage of conventional MIM elements is their production inefficiency because a vacuum device is repeatedly used in the formation of the film to avoid spattering.

Accordingly, it is desirable to provide a new MIM element and method of fabricating them which overcomes the problems of the prior art outlined above.

SUMMARY OF THE INVENTION

Generally speaking, in accordance with the invention, an improved bidirectional nonlinear resistor is provided. The bidirectional nonlinear resistor includes a highly insulating organic film formed on a first conductor by an electrolytic polymerization of an electrolytic solution containing a solvent, a supporting electrolyte and a soluble organic compound. The bidirectional nonlinear resistor also includes a second conductor, which may be identical with the first conductor, formed on the organic film.

In a preferred embodiment, the electrolytic solution includes an alkali hydroxide as a supporting electrolyte and a solvent including water, alcohol or a mixture thereof. The resulting insulating organic film does not need dopant ions removed after formation of the film. Specifically, the electrolytic solution which is electrolytically polymerized to form the insulating organic film is a solution including a monomer, such as pyrrole, pyrrole derivatives, phenol or phenol derivatives, dissolved in an electrolytic solution. If necessary, a pH buffering solution is added to the electrolytic solution.

In an active matrix liquid crystal panel including the bidirectional nonlinear resistor, an electrode of a designated pattern can be formed on a first transparent substrate. A highly insulating electrolytic polymer film is then formed on the first conductor by electrolytic polymerization of an electrolytic solution. The polymer film is formed by electrolytic polymerization of a electrolytic solution containing a monomer, preferably pyrrole, pyrrole derivatives, phenol or phenol derivatives, dissolved in an electrolytic solution. If necessary, a pH buffering solution is added to the electrolytic solution.

A second conductor is formed on the entire surface of the transparent substrate and the second conductor is shaped in the designated pattern, thereby forming a conductor/insulator/conductor nonlinear resistor. To form an electro-optical display device, a second transparent substrate having formed transparent electrodes of a designated pattern for cooperating with the electrode on the first substrate is securely attached to the first active matrix substrate with a sealing material for receiving the electro-optical material.

Accordingly, it is an object of the invention to provide an improved bidirectional nonlinear resistor.

It is another object of the invention to provide an active matrix liquid crystal panel which includes a bidirectional nonlinear resistor.

It is further object of the invention to provide an electro-optical display device including an active matrix substrate with a bidirectional nonlinear resistor as a switching element for providing picture quality comparable to that of a display including a TFT element.

Yet another object of the invention is to provide a bidirectional nonlinear resistor which can be produced inexpensively.

Yet a further objection of the invention is to provide a method for producing active matrix liquid crystal panels including bidirectional nonlinear resistors in high yields.

Still other objects and advantages of the invention will, in part, be obvious and will, in part, be apparent from the specification.

The invention accordingly comprises the several steps and the relation of one or more of such steps with respect to each of the others, and the apparatus embodying features of construction, combination of elements and arrangements of parts which are adapted to effect such characteristics, all as exemplified in the following detailed disclosure, and the scope of the invention will be indicated in the claims.

BRIEF DESCRIPTION OF THE DRAWINGS

For a fuller understanding of the invention, reference is made to the following description taken in connection with the accompanying drawings, in which:

FIG. 1 is a sectional view of a conventional MIM element;

FIG. 2 is a flow diagram comparing steps to prepare the conventional active element and an active element in accordance with the invention;

DESCRIPTION OF THE PREFERRED EMBODIMENTS

Figure 4:
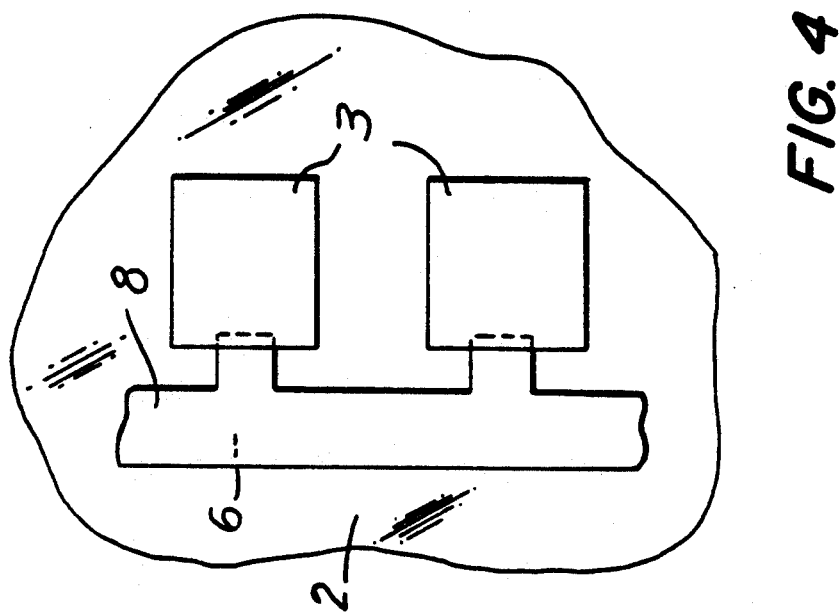
FIG. 4 is a top plan view of two picture elements of an active matrix prepared in accordance with the invention.

A MIM switching element 1 prepared in accordance with the prior art is shown in FIG. 1. MIM 1 includes a Ta wire 6 deposited on a glass substrate 2 and a $TaO_x$ insulator film 4 deposited on Ta wire 6. An ITO transparent electrode 3 is deposited adjacent to Ta wire 6 in a selective pattern and a Cr connector 5 is deposited to couple electrically ITO electrode 3 to MIM 1. The processing steps to form MIM 1 of FIG. 1 are set forth in the flow diagram of FIG. 2a.

Figure 3:
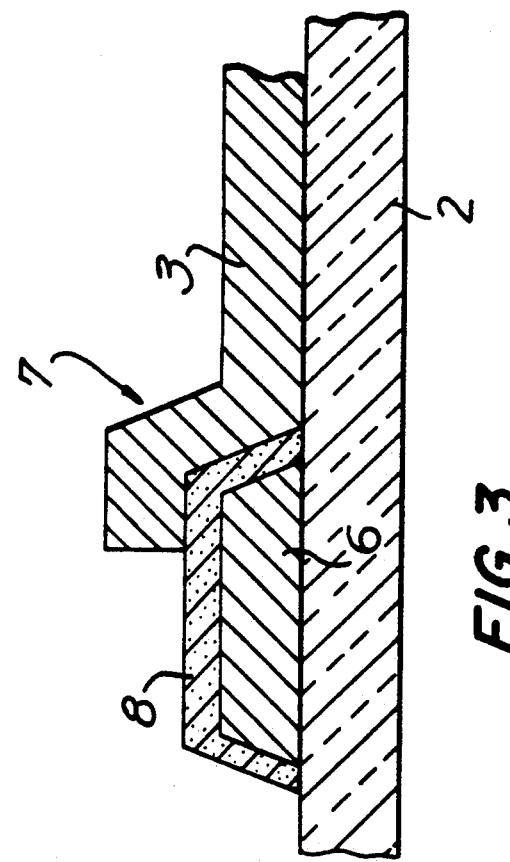
FIG. 3 is a sectional view of an active element prepared in accordance with the invention.

FIG. 3 illustrates the structure of a MIM 7 prepared in accordance with the processing steps in accordance with the invention as set forth in the flow diagram of FIG. 2b. A first conductive wiring 6 is deposited on substrate 2 and a highly insulating film 8 is deposited on conductive wiring 6. ITO electrode 3 is then selectively deposited on substrate 2 as in the device of FIG. 1. These steps are also graphically shown in FIGS. 17A-D.

A bidirectional nonlinear resistor in accordance with the invention is produced by forming a highly insulating organic film on a first conductor by electrolytic polymerization using an electrolytic solution containing at least a supporting electrolyte and an organic compound soluble in the electrolytic solution. A second conductor is formed on the organic film. The second conductor may be the same or a different material than the first conductor.

An active matrix panel including this bidirectional nonlinear resistor utilizes the bidirectional resistor as an active switching element for driving an electro-optical display device. The method for preparing the active matrix panel includes forming a first conductive wire in a designated pattern on a first transparent substrate, and forming a highly insulating electrolytic polymer film on the first conductive wire by electrolytic polymerization and forming a transparent electrode on the entire surface of the first substrate, shaping the transparent electrode into the designated pattern to form a conductor-/insulator/conductor nonlinear resistor. In a display device this active substrate is securely attached to a second transparent substrate with a sealing material which has cooperating transparent electrodes of a designated pattern for cooperating to drive the electro-optical material sealed in the space between the two substrates.

The electrolytic polymerization film has various physical properties, such as diode properties, which are already known in the art. The bidirectional nonlinear resistor is not known in the art. An element employing an electrolytic polymer film according to the invention provides bidirectional nonlinear resistivity, a character heretofore unknown in the art. Also provided is a method for the production of an active matrix panel using that bidirectional resistor as an active element.

The process to prepare the bidirectional resistor in accordance with the invention is as follows. First, a substance which will form a conductor is applied selectively to a transparent substrate. The conductor may be a transparent conductive film or semiconductor, of metals such as Au, Ag, Cu, Ni, Cr, and Ta, or alloys of such metals, or oxides such as $SnO_2$ and ITO. The methods which can be used to form the film include, but are not limited to, spattering, vacuum evaporation, CVD, and plating. The conductor thus formed on the transparent substrate is shaped into the designated pattern by photolithoetching.

Second, a highly insulating organic film is formed on the conductor by electrolytic polymerization. The electrolytic polymerization solution contains at least a monomer to be polymerized and a supporting electrolyte. The solution also contains a solvent capable of dissolving both the monomer and the supporting electrolyte. Solvents which may be used include, but are not limited to, water, alcohols, acetonitrile and propylene carbonates.

Monomers which can be used for the electrolytic polymerization include, but are not limited to, aromatic compounds such as aniline and phenol which contain an amino group and a hydroxyl group, respectively, on a benzene ring. Heterocyclic compounds, such as pyrrole and thiophene, polycyclic hydrocarbons such as azulene and pyrene which include two or more condensed aromatic rings, and organic compounds including an unsaturated bond may also be used.

The supporting electrolyte is capable of imparting ample electroconductivity to the electrolytic solution. Supporting electrolytes which may be used include, but are not limited to, $NaClO_4$, $LiClO_4$, $NaBF_4$, NaOH, $H_2SO_4$, and $Na_2SO_4$, for example. This supporting electrolyte is incorporated in the electrolytic solution in a concentration in the range of 0.1 to 1 mol/liter.

The methods of electrolysis which are available for the polymerization of the organic substance include, but are not limited to, the potential sweeping electrolytic method, the constant potential electrolytic method, the constant current electrolytic method, and the AC electrolytic method.

Different methods are available for the formation of the highly insulating organic film in the present invention.

A first method includes forming the organic film by electrolytic polymerization and subsequently depriving the film of ions. This removal of ions from the organic film can be attained by applying a potential of reverse polarity to the electrolytic solution in which the organic film has been formed by electrolytic polymerization.

However, this method has problems inherent with the removal of ion, known as "undoping". Removing dopant ion completely is difficult. If the dopant ion is not completely removed, the film surface may be affected and reproducible characteristics may be difficult to obtain. The additional step of ion removal generally complicates the formation of the element.

Thus, the second method, which involves forming an electrochemically-inactive film, is preferred. This method can be accomplished by suitably combining the composition of the electrolytic solution, the conditions of electrolysis, the materials of electrodes, and the like. For example, a pyrrole produces an electrochemically-inactive film when polymerized in an aqueous alkali hydroxide solution. Also, a phenol or a derivative thereof produces an electrochemically-inactive film when electrolytically oxidized with carbon electrodes in an acetonitrile solution (a supporting electrolyte $NaClO_2$). It also forms an inactive polyphenylene oxide film when it is subjected to electrolytic oxidation in basic methanol. 1,2-Diaminobenzene forms an electrochemically inactive film when electrolyzed in a neutral solution.

The preferred electrolytic solution is an electrolytic solution containing a monomer to be polymerized in a solvent and alkali hydroxide. The solvent is water, alcohol, or a combination thereof. If necessary, a pH buffering solution or the like is added. The monomer is preferably selected from the group of pyrrole, phenol or a derivative of pyrrole or phenol. The preferred alkali hydroxide includes, but is not limited to, NaOH, KOH, or LiOH. The preferred pH value of the solution is 10 or more, with a particularly preferred value of between about 10 to 13.

Thus, an electrochemically inactive film can be formed without having to remove ions afterwards, thus simplifying the manufacturing procedure. Additionally, switching elements made in this manner have a smoother surface and even more stable characteristics than conventional elements. Active matrix liquid crystal panels using these type of non-linear resistor switching elements have improved contrast. Moreover, the area of the element can be larger than conventional elements because of the switching stability, so the preparation of the element in the liquid crystal panel is facilitated.

Examples of the formation of such electrochemically inactive films are given in Examples 19-23 below.

In a particularly preferred embodiment, the organic film produced has a thickness in the range of 100 Å to 2 $\mu$m. If the thickness is less than 100 Å, the organic film is so porous as to induce ready formation of a short circuit between the conductors opposed to each other across the organic film. If the thickness exceeds 2 $\mu$m, the resulting bidirectional nonlinear resistor offers too high resistance in spite of the nonlinearity thereof for bidirectional nonlinear resistor to be utilized effectively as an active element for a liquid crystal panel.

A metallic film of a designated pattern is formed on the organic insulator as described above to yield a conductor/insulator/conductor nonlinear resistor (two-terminal element). The second conductor may be formed by the technique of spattering, vacuum evaporation, or CVD with a compound based on a metal such as Au, Ag, Cu, Pt, Ni, Co, Cr, Fe, Ta, or Ti or a metal oxide such as $SnO_2$, $In_2O_3$, ZnO, CdO, ZnS, CdS, or $CdSnO_4$.

Figure 5:
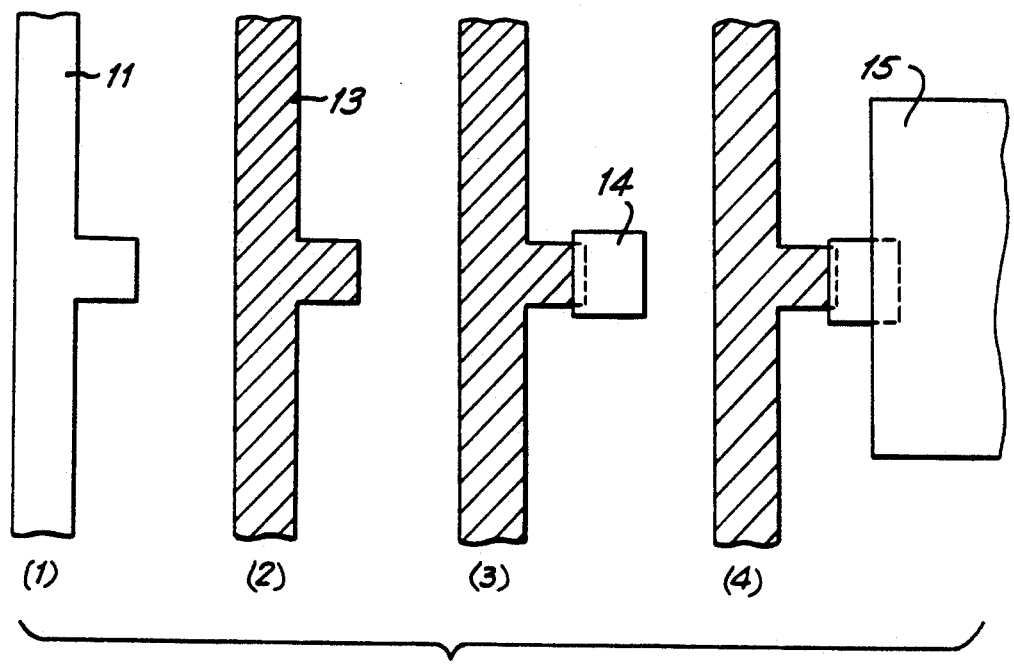
FIG. 5 illustrates the steps to prepare a two-terminal element in accordance with the invention.

Three methods other than the basic method described above are available for the formation of the active element suitable for use in producing an active matrix liquid crystal panel in accordance with the invention. The first method, as illustrated in FIG. 5, includes a first step of forming a first conductor layer 11 of a designated pattern on a first transparent substrate 10, a second step of forming a highly insulating electrolytic polymer film 13 on electrode 11 by electrolytic polymerization, a third step of forming a second conductor 14 identical or not with first conductor 11 into the designated pattern, thereby forming a conductor/insulator/ conductor nonlinear resistor, and a fourth step of forming a picture element 15 with the transparent conductor film in the shapes illustrated in FIG. 5 and in cross-section in FIG. 6. Methods of forming or depositing picture elements are known in the art.

Figure 7:
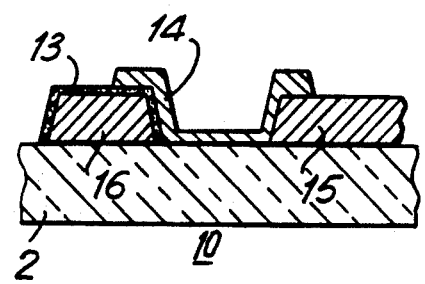
FIG. 7 is a cross-sectional view of a two-terminal element prepared in accordance with another embodiment of the process of FIG. 5.

Optionally, the picture element 1 5 is deposited before second conductor 14 to yield the cross-sectional shape of FIG. 7 when the first and fourth steps are carried out simultaneously. Methods of simultaneously forming a conductor layer on a transparent substrate while forming a picture element with the transparent conductor film are known in the art.

Figure 6:
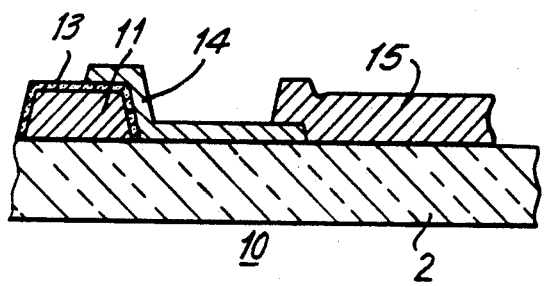
FIG. 6 is a cross-sectional view of a two-terminal element prepared in accordance with the processing steps of FIG. 5.

FIGS. 6 and 7 are cross-sectional views of active elements formed by the process shown in FIG. 5. The reference numerals 11 to 15 found in FIG. 6 correspond to like reference numerals found in FIG. 5. The reference numeral 16 found in FIG. 7 denotes what is produced by first forming first conductor layer 16 and picture elements 15 with the transparent conductor, forming electrolytic polymer film 13 only on conductor layer 16, and thereafter forming second conductor 14 identical or not in composition to first conductor layer 16 in the designated pattern.

Figure 8:
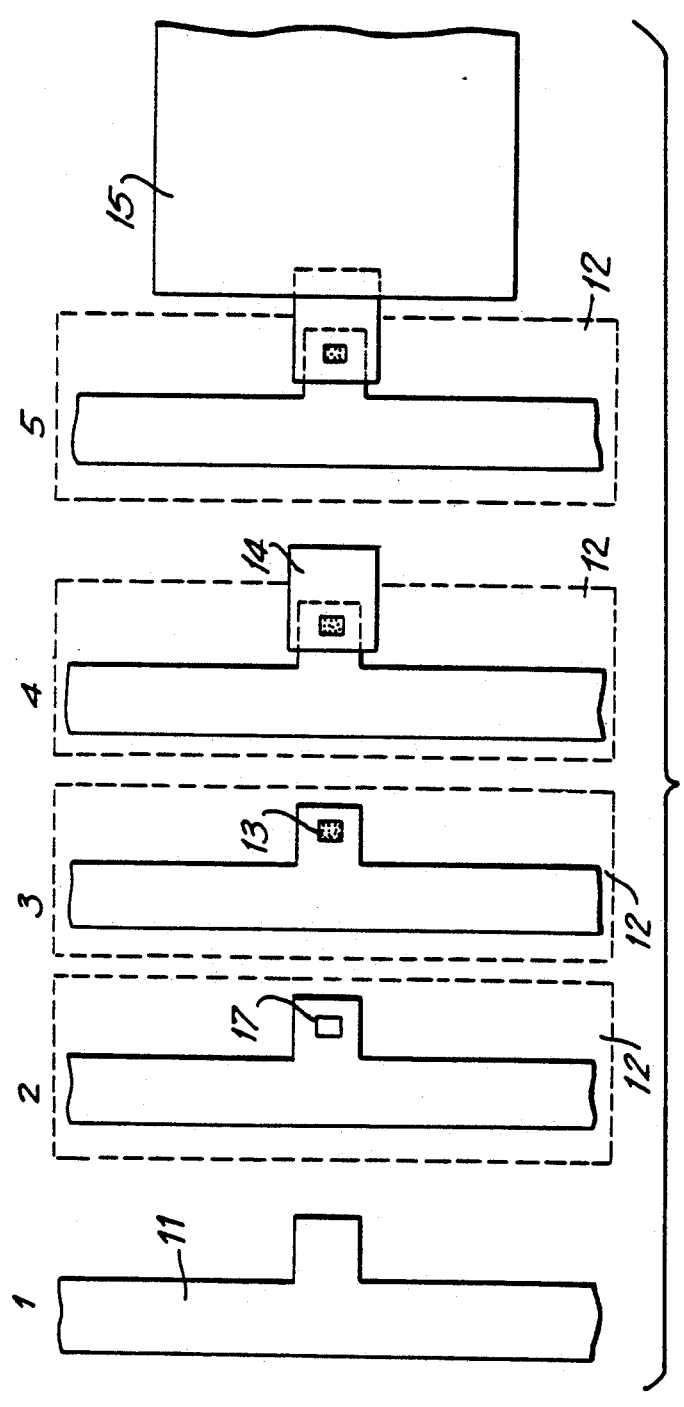
FIG. 8 illustrates the steps to prepare a two-terminal element in accordance with the invention.
Figure 9:
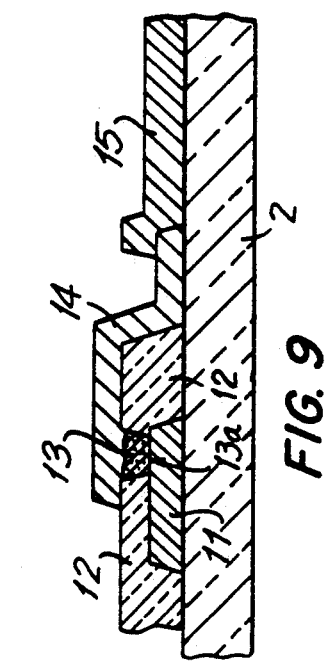
FIG. 9 is a cross-sectional view illustrating the two-terminal element of FIG. 8.

A second method to prepare the active element in accordance with the invention includes a first step of forming on a first transparent substrate 2 an electrode 11 of a designated pattern as illustrated in FIG. 9, a second step of forming transparent insulating film 12 either on the entire surface of transparent substrate 2 or only on electrode 11 and forming in the designated part of insulator film 12 a contact hole 13a communicating with the electrode, a third step of forming an electrolytic polymer film 13 on electrode 11 through contact hole 13a by electrolytic polymerization, a fourth step of forming conductor 14 into the designated pattern thereby forming a conductor/insulator/conductor nonlinear resistor, and a fifth step of forming picture element 15 with a transparent conductor film in the shape illustrated in FIG. 8.

Figure 10:
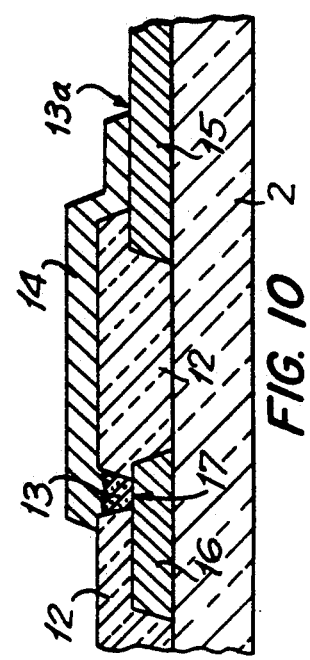
FIG. 10 is a cross-sectional view of another two-terminal element prepared in accordance with the processing steps of FIG. 8

Optionally, the active element and the picture element having the cross-sectional shape shown in FIG. 10 may be obtained by simultaneously carrying out the first and fifth steps and forming contact holes 13a on first electrode 11 and on picture element 15 in the second step.

FIGS. 9 and 10 are cross-sectional views of active elements formed by the process illustrated in FIG. 8. Reference numerals 11 to 15 in FIG. 9 correspond to like reference numerals in FIG. 8.

The active element of FIG. 10 is produced by first forming simultaneously a first electrode 16 and picture element 15 with transparent conductor 14, then forming insulator film 12, subsequently forming a contact hole 17 through insulator 12, depositing electrolytic polymer film 13 in contact hole 17, and thereafter forming conductor 14.

In this process, transparent conductor film 14 coats substrate 2 after first conductor 16 is formed in the designated pattern. In the designated position of insulator film 12, contact hole 17 is formed so as to communicate with first conductor layer 16 [FIG. 8]. The coating with insulator layer 12 may be effected on the entire surface or on part of the surface as illustrated in FIGS. 9 and 10.

Materials which may be used for transparent insulator film 14 include, but are not limited to, epoxy resin, acryl resin, polyimide resin, polyamide resin, polyvinyl resin, nylon resin, polyester resin, acetate resin, phenoxy resin and the like. Optionally, the insulator film may be formed by subjecting an organic metal compound to dehydrocondensation. Organic metal compounds which may be used include, but are not limited to, those including silicon, titanium, tantalum, chromium, aluminum, indium, tungsten, molybdenum, zirconium, and germanium, as central metals.

The insulator film may be a thermosetting type or an ultraviolet-setting type. The insulator film can be formed by the offset printing, the flexiso printing, or the screen printing. Optionally, the contact hole may be formed by the photolithoetching technique after the insulator film is formed on the entire surface. Thereafter, the process is the same as first method.

In a third method in accordance with the invention, alternatively to the second method described above, a transparent conductor film may be formed as the conductor in the fourth step as illustrated in FIG. 5, and the conductor/insulator/conductor nonlinear resistor and the picture element may be simultaneously formed.

The invention will be described more specifically in the following examples which are set forth for purposes of illustration only and not in a limiting sense.

EXAMPLE 1

An electrolytic polymerization solution was prepared using a solution containing 0.1 mol of N-methyl pyrolle and 0.5 ml of sodium perchlorate per liter of propylene carbonate solvent. An ITO (indium-tin oxide) electrode for the formation of a nonlinear resistor was formed by vacuum evaporation on a glass substrate. The ITO electrode was covered using a photoresist, except for a hole 300 $\mu$m in diameter and a contact part intended for contact with an external electrode.

The aforementioned solution was electrolytically polymerized by using the ITO electrode as a test electrode, a platinum electrode as a counter electrode, and a silver oxide electrode as a reference electrode. Specifically, constant potential polymerization was performed at +0.9 V at the reference electrode to form a poly-N-methyl pyrrole film 5,000 Å in thickness. Dope was then thoroughly removed at −0.4 V at the reference electrode. The result of this electrolytic un-doping was the conversion of the electrolytic polymer film into an insulator film.

Figure 11:
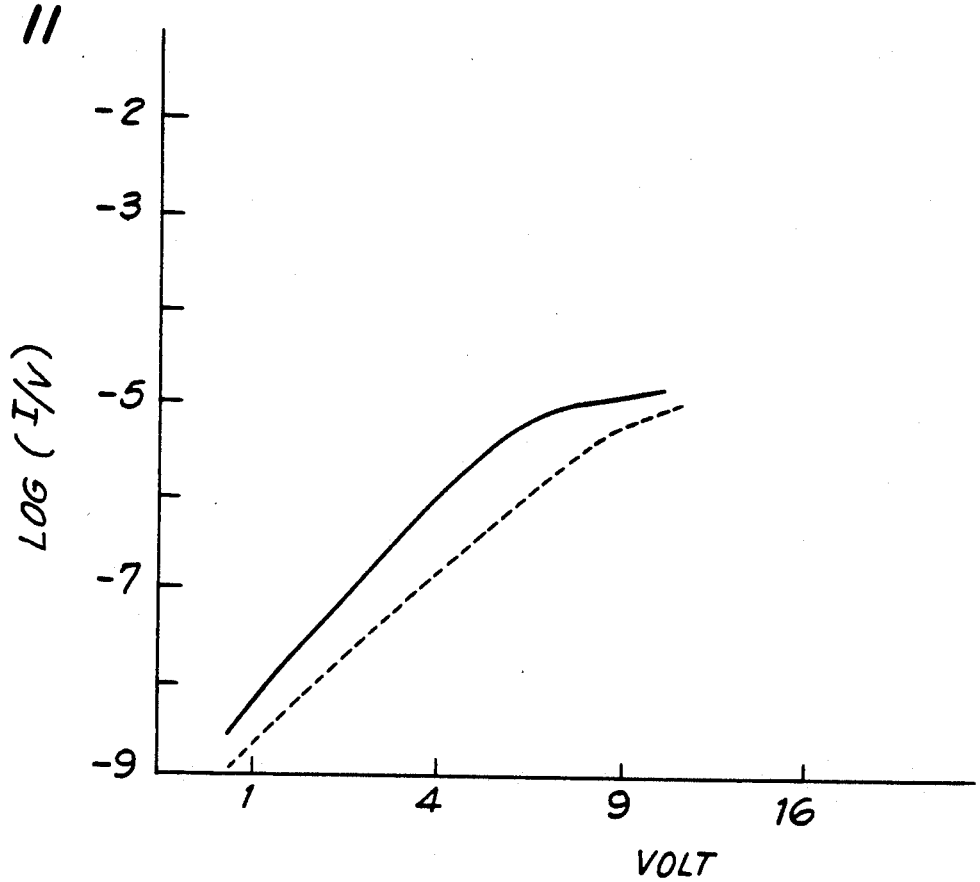
FIG. 11 is an I/V characteristic diagram of an MIM element prepared in accordance with Example 1.

An ITO film was superposed by spattering onto the electrolytic polymer film. The resulting MIM element was tested for I-V characteristics, and the results are shown in the graph in FIG. 11. The broken lines represent data obtained when the underlying electrode on the substrate side had negative polarity and the continuous lines represent data obtained when the same electrodes had positive polarity. As is clearly noted from the graph, the MIM element is bidirectionally nonlinear, irrespective of the polarity of the substrate electrode.

EXAMPLE 2

An electrolytic solution of 0.2 mol of pyrrole and 0.2 mol of lithium perchlorate per liter of propylene carbonate was prepared. Except for a different electrolytic solution, an MIM element was formed by following the procedure of Example 1. Again, the electrolysis was performed at a constant current.

Figure 12:
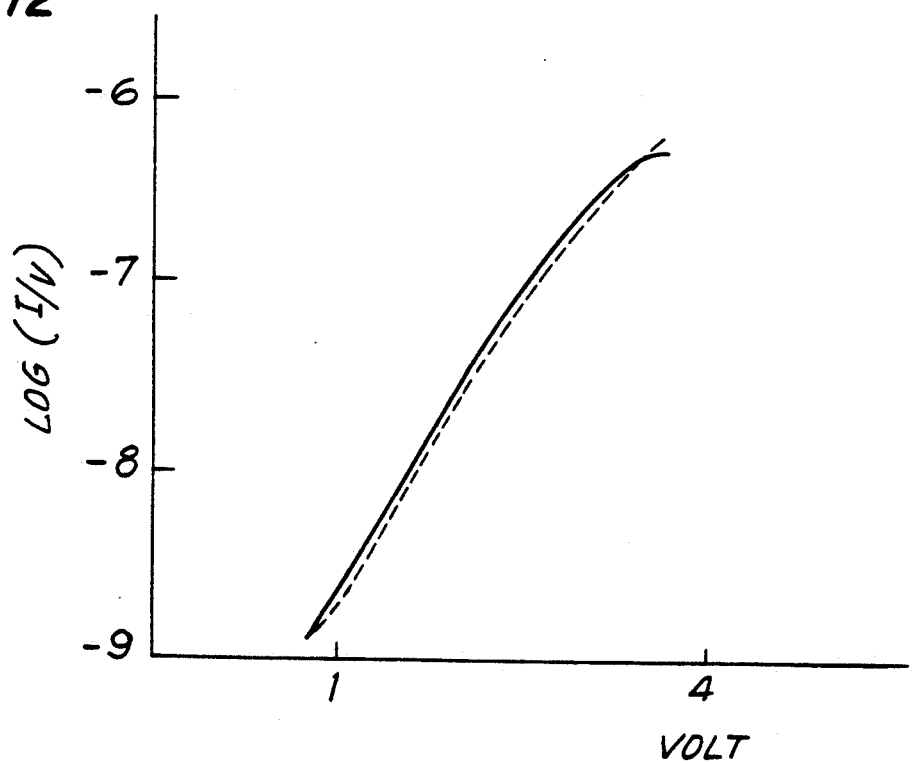
FIG. 12 is an I/V characteristic diagram of an MIM element prepared in accordance with Example 2.

The I-V characteristic curve for the MIM element is shown in FIG. 12. As is clearly noted from the graph, the MIM element is bidirectionally nonlinear, irrespective of the polarity of the substratal electrode.

EXAMPLE 3

An electrolytic solution was prepared by dissolving 0.05 mol of 2,6-dimethyl phenol and 0.3 mol of sodium hydroxide per liter of methanol. An ITO electrode was formed by following the procedure of Example 1 except the electrolytic solution was subjected to constant potential electrolysis at +2.2 V. The time at which the electric current ceased to flow was taken as the end point of the electrolysis.

Figure 13:
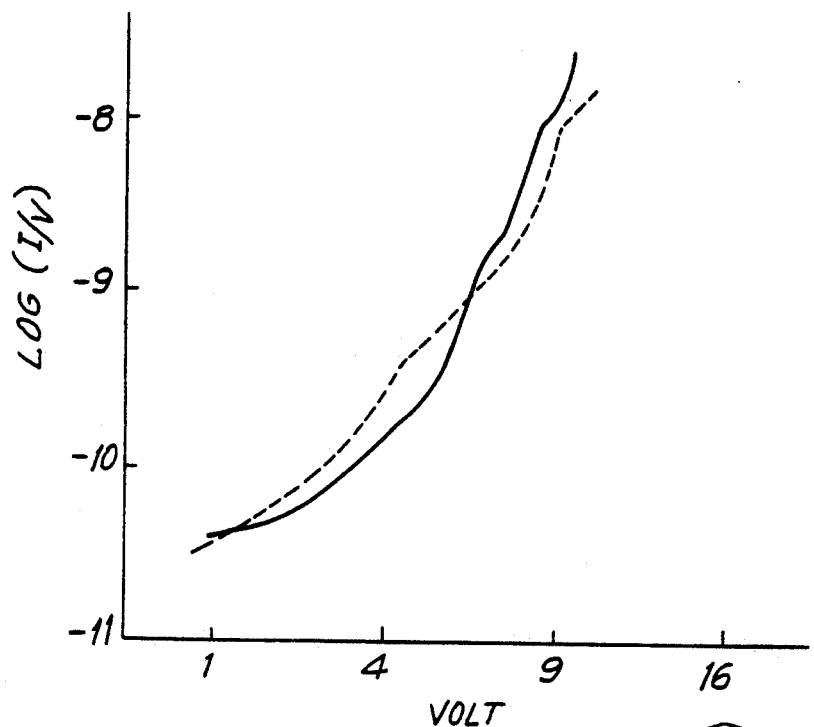
FIG. 13 is an I/V characteristic diagram of an MIM element prepared in accordance with Example 3.

An ITO film was spattered onto the electrolytic polymer film thus obtained. The resulting MIM element was tested for I-V characteristics, and the results are shown in the graph in FIG. 13. As is clearly noted from the graph, the MIM element is bidirectionally nonlinear, irrespective of the polarity of the substratal electrode.

EXAMPLE 4

The electrolytic solution was obtained by dissolving 0.05 mol of phenol and 0.3 mol of sodium hydroxide per liter of methanol. A MIM element was formed by following the procedure of Example 3 and tested for I-V characteristics. As in the other examples, a bidirectional nonlinear resistance was obtained.

EXAMPLE 5

An element having a poly-N-methyl pyrrole layer 1 μm in thickness deposited on an ITO electrode was formed and tested for the I-V characteristics by following the procedure of Example 1. As in Example 1, a nonlinear resistor was obtained.

EXAMPLE 6

An ITO (indium-tin oxide) film measuring 1,500 Å in thickness and provided with multiple ribbon electrode patterns was formed on a glass substrate by spattering.

An electrolytic polymerization solution containing 0.1 mol of N-methyl pyrrole and 0.5 mol of lithium perchlorate per liter propylene carbonate solvent was prepared and subjected to bubbling nitrogen gas. A platinum plate was used as a counter electrode and a silver oxide electrode as a reference electrode. The electrolytic polymerization solution, with the aforementioned ITO-deposited glass substrate immersed therein, was subjected to electrolytic polymerization at a constant potential of $+1.0$ V for 15 minutes to superpose a poly-N-methyl pyrrole film 4,000 Å in thickness onto the ITO film. Dope was then removed by electrolysis at $-0.8$ V until the electric current decreased to 0.

The composite element was washed with purified water and dried at 120° C. An ITO film was formed in a thickness of 500 Å on the entire surface of the glass substrate by spattering. The ITO film was patterned by photolitho-etching into the shape of the element shown in FIGS. 3 and 4 to produce an element at the designated position on the multiple ribbon electrodes.

Figure 16:
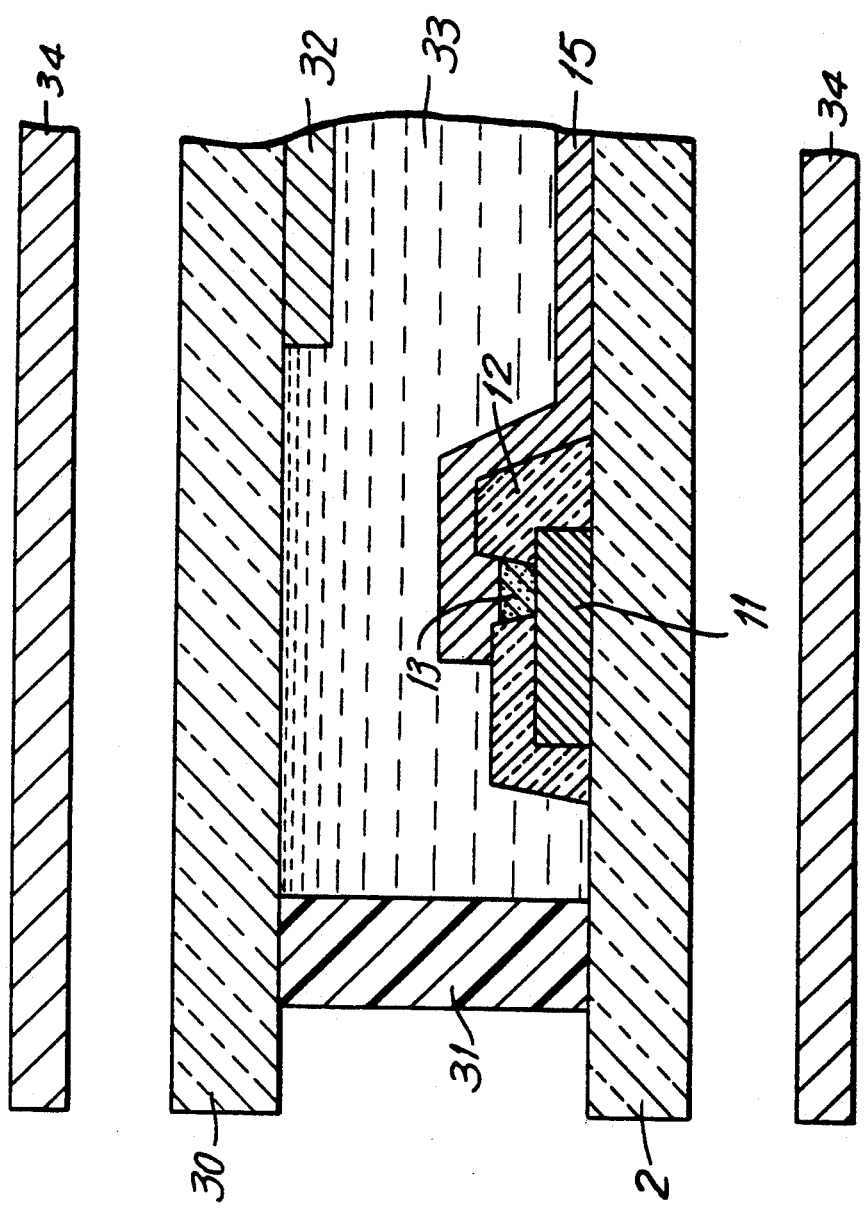
FIG. 16 is a cross-sectional view of a liquid crystal panel including a bidirectional nonlinear resistor in accordance with the invention.
Figure 17A:
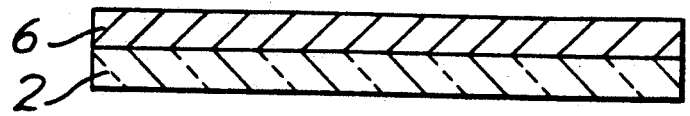
FIGS. 17A-D are cross-sectional views illustrating the steps to prepare a nonlinear resistor switching element in accordance with the invention.
Figure 17B:
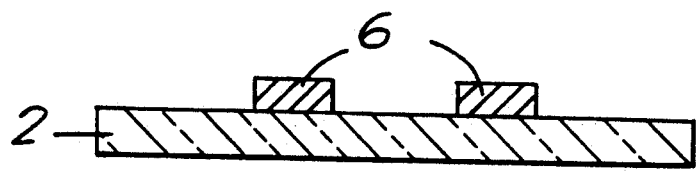
Figure 17C:
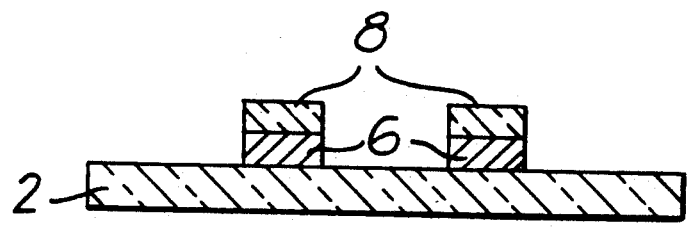
Figure 17D:
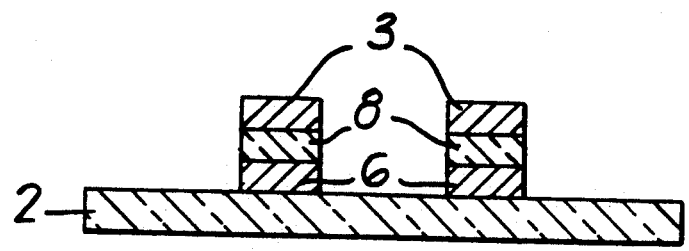

To form the liquid crystal panel shown in FIG. 16, a second glass substrate 30 was prepared as a counter substrate by depositing multiple rows of ITO electrodes 32 thereon. The first and second substrates were secured together by a spacer 31 and filled with liquid crystal material 33. Polarizers 34 were disposed on the outside of substrates 2 and 30.

This liquid crystal panel was driven with the same drive circuit as used for a conventional MIM panel to determine contrast. It was found that the panel produced herein had better contrast than the conventional panel. The improved contrast occurs because poly-N-methyl pyrrole film has a smaller specific dielectric constant and a larger film thickness than $TaO_x$ film.

EXAMPLE 7

An electrolytic solution was prepared by dissolving 0.05 mol of 2,6-dimethyl phenol and 0.3 mol of sodium hydroxide per liter of methanol. Thereafter, an ITO electrode on a glass substrate was subjected to constant potential electrolysis at $+2.2$ V to form an electrolytic polymer film. The time at which the electric current decreased to 0 was taken as the end point of the electrolysis.

An active matrix liquid crystal panel was produced by following the procedure of Example 6. In the comparative test performed in the same manner as in Example 6, the panel was found to have better contrast than the conventional MIM panel.

EXAMPLE 8

An active matrix liquid crystal panel was produced by following the procedure of Example 6, except the thickness of the electrolytic polymer film was increased to 1,000 Å. The results were the same as in Example 6.

EXAMPLE 9

A Ta film with multiple ribbon electrode patterns was formed on a glass substrate in a thickness of 1,500 Å by spattering.

An electrolytic polymerization solution containing 0.1 mol of N-methyl pyrrole and 0.5 mol of lithium perchlorate per liter of propylene carbonate was prepared and subjected to bubbling nitrogen gas. A platinum plate was used as a counter electrode and a silver oxide electrode as a reference electrode. The electrolytic polymerization solution, with the Ta-deposited glass substrate immersed therein, was subjected to electrolytic polymerization at a constant voltage of $+0.1$ V for 15 minutes to superpose a poly-N-methyl pyrrole film about 4,000 Å in thickness on the Ta film. The dope was then removed by electrolysis at $-0.8$ V until the electric current decreased to 0.

Thereafter, the resulting composite element was washed with purified water and dried at 120° C. A Cr alloy film was formed in a thickness of 500 Å on the entire surface of the glass substrate by spattering.

This Cr alloy film was patterned by photolitho-etching into the shape of the element shown in FIGS. 5(3) and 6 to produce an element at the designated position on the multiple ribbon electrodes.

An ITO (indium-tin oxide) film was then formed on the element in a thickness of 500 Å in the shape shown in FIGS. 5(4) and 6 by spattering and photolitho-etching.

A second glass substrate was prepared as an opposed substrate by depositing multiple rows of ITO electrodes thereon. The first and second substrates were securely attached by a spacer to form a liquid crystal panel, thereby producing an active matrix liquid crystal panel.

This liquid crystal panel was driven with the same drive circuit as used for a conventional MIM panel to determine contrast. It was found that the panel produced herein had better contrast than the conventional panel. The improved contrast occurs because poly-N-methyl pyrrole film has a smaller specific dielectric constant and a larger film thickness than $TaO_x$ film.

EXAMPLE 10

An electrolytic solution was obtained by dissolving 0.05 mol of 2,6-dimethyl phenol and 0.3 mol of sodium hydroxide per liter of methanol. Thereafter, an ITO electrode on a glass substrate was subjected to constant potential electrolysis at $+2.2$ V to form an electrolytic polymer film by following the procedure of Example 9. The time at which the electric current decreased to 0 was taken as the end point of the electrolysis.

An active matrix liquid crystal panel was produced by following the procedure of Example 9 and compared with the conventional MIM panel. The panel of this example was found to have better contrast than the conventional panel.

EXAMPLE 11

An ITO (indium-tin oxide) film measuring 2,000 Å in thickness in a multiple ribbon electrode pattern was formed on a glass substrate by spattering.

An electrolytic polymerization solution containing 0.1 mol of N-methyl pyrrole and 0.5 mol of lithium perchlorate per each liter polypropylene carbonate was prepared and subjected to bubbling nitrogen gas. A platinum plate was used as a counter electrode and a silver oxide electrode as a reference electrode. The ITO-deposited glass substrate was immersed in the polymerization solution and subjected to electrolytic polymerization at a constant potential of +1.0 V for 15 minutes to form a poly-N-methyl pyrrole film in a thickness of about 4,000 Å on the ITO. Dope was then removed by electrolysis at −0.8 V.

The resulting component element was washed with purified water and dried at 120° C. A Cr alloy film was formed in a thickness of 500 Å on the entire surface of the glass substrate by spattering.

This Cr alloy film was patterned by photolitho-etching into the shape of the element shown in FIGS. 5(3) and 6 to yield an element at the designated position on the multiple ribbon electrodes. This element yielded the same improved contrast in the resulting liquid crystal panel as in Example 6.

EXAMPLE 12

A Ta film measuring 1,500 Å in thickness in a multiple ribbon electrode pattern was formed on a glass substrate by spattering.

An epoxy acrylate resin (produced by Okuno Seiyaku K.K. and marketed under the trademark "SO Clear") was superposed on the Ta film by spin coating, resulting in a transparent insulator film 2 $\mu$m in thickness. This transparent film was exposed to ultraviolet light through a photomask of a designated pattern. A 10 $\mu$m-diameter contact hole intended for contact with the ITO electrode was thereby formed.

Next, an electrolytic polymerization solution containing 0.1 mol of N-methyl pyrrole and 0.5 mol of lithium perchlorate per liter propylene carbonate was prepared and subjected to bubbling nitrogen gas. A platinum plate was used as a counter electrode and a silver oxide electrode as a reference electrode. The electrolytic polymerization solution, with the aforementioned Ta-deposited glass substrate immersed therein, was subjected to electrolytic polymerization at a constant potential of +1.0 V for 15 minutes to form a poly-N-methyl pyrrole film about 4,000 Å in thickness on the ITO. Dope was then removed by electrolysis at −0.8 V until the electric current decreased to 0.

The composite element was washed with purified water and dried at 120° C. A Cr film was formed in a thickness of 500 Å on the entire surface of the glass substrate by spattering.

This Cr film was patterned by photolitho-etching into the shape of the element shown in FIGS. 8(4) and 9 to yield an element at the designated position on the multiple ribbon electrodes. An ITO (indium-tin oxide) film 500 Å thick was formed on this element by spattering and photolitho-etching in the shape shown in FIG. 8(5) and 9.

A second glass substrate was prepared as a counter substrate by depositing multiple rows of ITO electrodes thereon. The first and second substrates were securely attached by a spacer to form an active matrix liquid crystal panel.

This liquid crystal panel was driven with the same drive circuit as used for a conventional MIM panel to determine contrast. It was found that the panel produced herein had improved contrast compared to the conventional panel. The improved contrast occurs because poly-N-methyl pyrrole film has a smaller specific dielectric constant and a larger thickness than a $TaO_x$ film.

EXAMPLE 13

An electrolytic solution was prepared by dissolving 0.05 mol of 2,6-dimethyl phenol and 0.3 mol of sodium hydroxide per liter of methanol. Thereafter, a Ta electrode disposed on a glass substrate was subjected to constant potential electrolysis at +2.2 V by following the procedure of Example 1 to form an electrolytic polymer film. The time at which the electric current decreased to 0 was taken as the end point of the electrolysis.

An active matrix liquid crystal panel was produced by following the procedure of Example 12. This panel was found to have better contrast then the conventional MIM panel.

EXAMPLE 14

An ITO (indium-tin oxide) film in a multiple ribbon electrode pattern and a picture element pattern was formed on a glass substrate in a thickness of 2,000 Å by spattering. Thereafter, an insulator film and a contact hole were formed by following the procedure of Example 1.

An electrolytic polymerization solution containing 0.1 mol of N-methyl pyrrole and 0.5 mol of lithium perchlorate per liter propylene carbonate was prepared and subjected to bubbling nitrogen gas. A platinum plate was used as a counter electrode and a silver oxide electrode was used as a reference electrode. The electrolytic polymerization solution, with the ITO-deposited glass substrate immersed therein, was subjected to electrolytic polymerization at a constant potential of +1.0 V for 15 minutes to form a poly-N-methyl pyrrole film 4,000 Å in thickness through a contact hole on the ITO film. The dope was then removed by electrolysis at −0.8 V until the electric current decreased to 0.

Thereafter, the completed composite element was washed with purified water and dried at 120° C. A Cr alloy film was formed in a thickness of 500 Å on the entire surface of the glass substrate by spattering. This Cr alloy film was patterned by photolithoetching into the shape of the element shown in FIGS. 8(4) and 9 to form an element at the designated position on the multiple ribbon electrodes.

Thereafter, an active matrix liquid crystal panel was prepared by following the procedure of Example 12 using the aforementioned substrate. This panel yielded the same improved contrast as in Example 12.

EXAMPLE 15

An ITO (indium-tin oxide) film measuring 1,500 Å in thickness in a multiple ribbon electrode pattern was formed on a glass substrate by spattering.

An epoxy acrylate resin (produced by Okuno Seiyaku K.K. and marketed under the trademark "SO Clear") was superposed on the ITO film by spin coating, resulting in a clear insulator film 2 $\mu$m in thickness. This insulator film was exposed to ultraviolet light through a photomask of a designated pattern. A 10 μm-diameter contact hole intended for contact with the ITO electrode was thereby formed.

Next, an electrolytic polymerization solution containing 0.1 mol of N-methyl pyrrole and 0.5 mol of lithium perchlorate per liter of propylene carbonate was prepared and subjected to bubbling nitrogen gas. A platinum plate was used as a counter electrode and a silver oxide electrode as a reference electrode. The electrolytic polymerization solution, with the Ta-deposited glass substrate immersed therein, was subjected to electrolytic polymerization at a constant potential of +1.0 V for 15 minutes to form a poly-N-methyl pyrrole film about 4,000 Å in thickness on the ITO. Dope was then removed by electrolysis at −0.8 V until the electric current decreased to 0.

Figure 14:
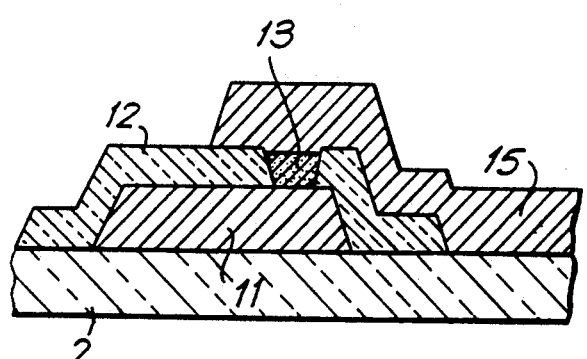
FIG. 14 is a cross-sectional view of an active element prepared in accordance with another embodiment of the invention.
Figure 15:
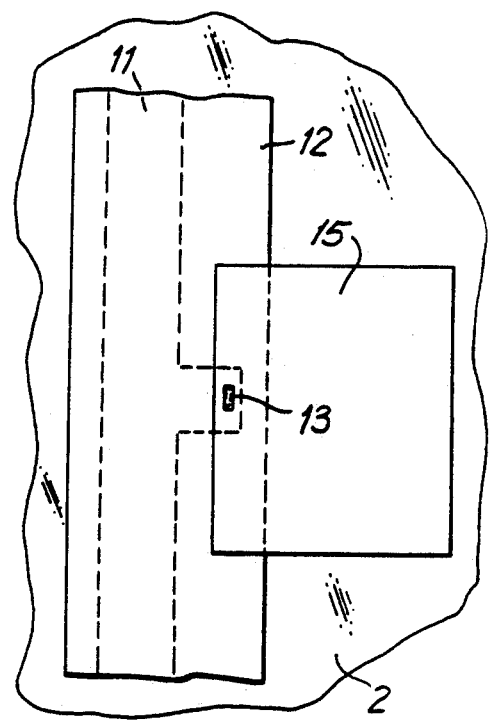
FIG. 15 is a plan view of the active element and picture electrode of FIG. 14.

The composite element was washed with purified water and dried at 120° C. An ITO film was formed in a thickness of 500 Å on the entire surface of the glass substrate by spattering. This ITO film was patterned by photolitho-etching into the shape of the element shown in FIGS. 14 and 15 to yield an element at the designated position on the multiple ribbon electrodes.

A second glass substrate was prepared as an opposed substrate by depositing multiple rows of ITO electrodes thereon. The first and second substrates were securely attached by a spacer to yield an active matrix liquid crystal panel.

This liquid crystal panel was driven with the same drive circuit as used for a conventional MIM panel to determine contrast. It was found that the panel produced herein had better contrast than the conventional panel. The improved contrast occurs because poly-N-methyl pyrrole film has a smaller specific dielectric constant and a larger thickness than $TaO_x$ film.

EXAMPLE 16

An active matrix element was produced by following the procedure of Example 15.

An electrolytic solution containing 0.05 mol of 2,6-dimethyl phenol and 0.3 mol of sodium hydroxide per liter of methanol was subjected to electrolysis at a constant potential of +2.2 V to form an electrolytic polymer film. The time at which the electric current decreased to 0 was taken as the end point of the electrolysis.

Thereafter, an active matrix panel was produced by following the procedure of Example 15. This panel was found to have better contrast than the conventional MIM panel.

EXAMPLE 17

An active matrix liquid crystal panel was produced by following the procedure of Example 15 to form an electrolytic polymer film in a thickness of 1,000 Å. The panel yielded the superior contrast as in Example 15.

EXAMPLE 18

On a 0.9 mm thick glass substrate (produced by Corning Corp. under the trademark "Pyrex 7059"), an ITO film 1,500 Å thick was formed by spattering. This ITO film was etched in a designated pattern by the photolitho process to form wiring 35 μm in width. An epoxy acrylate resin (produced by Okuno Seiyaku K.K. under the trademark "SO Clear") was superposed on this wiring in a thickness of 3 μm by spin coating and then shaped into a designated pattern by the photolitho process. This pattern had 18 μm-diameter contact holes spaced at fixed intervals on the wiring.

Next, an electrolytic polymer film 5,000 Å thick of poly-N-methyl pyrrole was formed on the ITO film through the contact hole 13 shown in FIG. 16, disposed in the electrolytic polymer film under the conditions described for Example 1. An ITO film was formed on this substrate with a thickness of 600 Å by spattering. The ITO film was etched in a designated pattern by the photolitho process to obtain a picture element electrode 15 measuring 170 μm in its side length and to form an MIM element part.

On an opposed glass counter substrate 13, 0.9 mm in thickness (produced by Corning Corp. under the trademark "Pyrex 7059"), a 1,500 Å thick ITO film was formed by spattering. This ITO film was formed in a designated pattern of a wire 32 and a pair of picture element electrodes.

The two substrates (MIM element substrate and counter substrate) obtained as described above were dipped in 0.1% amino silane solution (produced by Nippon Soda Co., Ltd. as product code "SH6020"), washed, fired at 180° C., and then subjected to an orienting treatment by rubbing.

The MIM element substrate and the counter substrate were securely attached to each other by using a thermosetting type epoxy resin 31 as a sealing agent containing glass fibers 6 μm in diameter as a cell gap retaining material. Keeping the two substrates pressed against each other for three hours at 150° C., a liquid crystal cell possessing an MIM element was obtained.

The liquid crystal cell was filled with liquid crystal 33 and tightly sealed by vacuum sealing. The liquid crystal used was a PCH (phenyl cyclohexane) type liquid crystal (produced by Merck under product code "ZLI-1695"). A liquid crystal display panel (QCD) was completed by securing a polarizing sheet 34 to the upper and lower surfaces of the liquid crystal panel.

When this liquid crystal display panel was operated with the same circuit as used for a conventional MIM panel, it exhibited good display properties at 1/480 duty.

EXAMPLE 19

An ITO (indium-tin oxide) film measuring 1,500 Å in thickness and provided with an electrode pattern of 50 μm in diameter was formed on a glass substrate by spattering.

An electrolytic polymerization solution containing 0.05 mol/l of 2,6-dimethylphenol and 0.05 mol/l of sodium hydroxide was prepared. A platinum plate was used as a counter electrode, and a silver-silver chloride electrode was used as a reference electrode. The electrolytic polymerization solution, with the aforementioned ITO-deposited glass substrate immersed therein, was subjected to electrolytic polymerization at a constant potential of +1.6 V for 30 minutes to superpose a polymethyl phenol film 2,000 Å in thickness onto the ITO film.

The composite element was washed with purified water and ethanol and dried gently with Ar gas. An ITO film was formed in a thickness of 500 Å on the entire surface of the glass substrate by spattering. The evaluation of the resulting I-V characteristics showed that satisfactory and stable switching characteristics were obtained without the additional ion removal step.

EXAMPLE 20

An ITO (indium-tin oxide) film measuring 1,500 Å in thickness and provided with an electrode pattern of 50 μm in diameter was formed on a glass substrate by spattering.

An electrolytic polymerization solution containing 0.25 mol/l of pyrrole and 0.05 mol/l of potassium hydroxide was prepared. A platinum plate was used as a counter electrode and a silver-silver chloride electrode as a reference electrode. The electrolytic polymerization solution, with the aforementioned ITO-deposited glass substrate immersed therein, was subjected to electrolytic polymerization at a constant potential of +1.4 V for 30 minutes to superpose a polypyrrole film 2,000 Å in thickness onto the ITO film.

The composite element was washed with purified water and ethanol and dried gently with Ar gas. An ITO film was formed in a thickness of 500 Å on the entire surface of the glass substrate by spattering. The evaluation of the resulting I-V characteristics showed that satisfactory and stable switching characteristics were obtained without the additional ion removal step.

Figure 18:
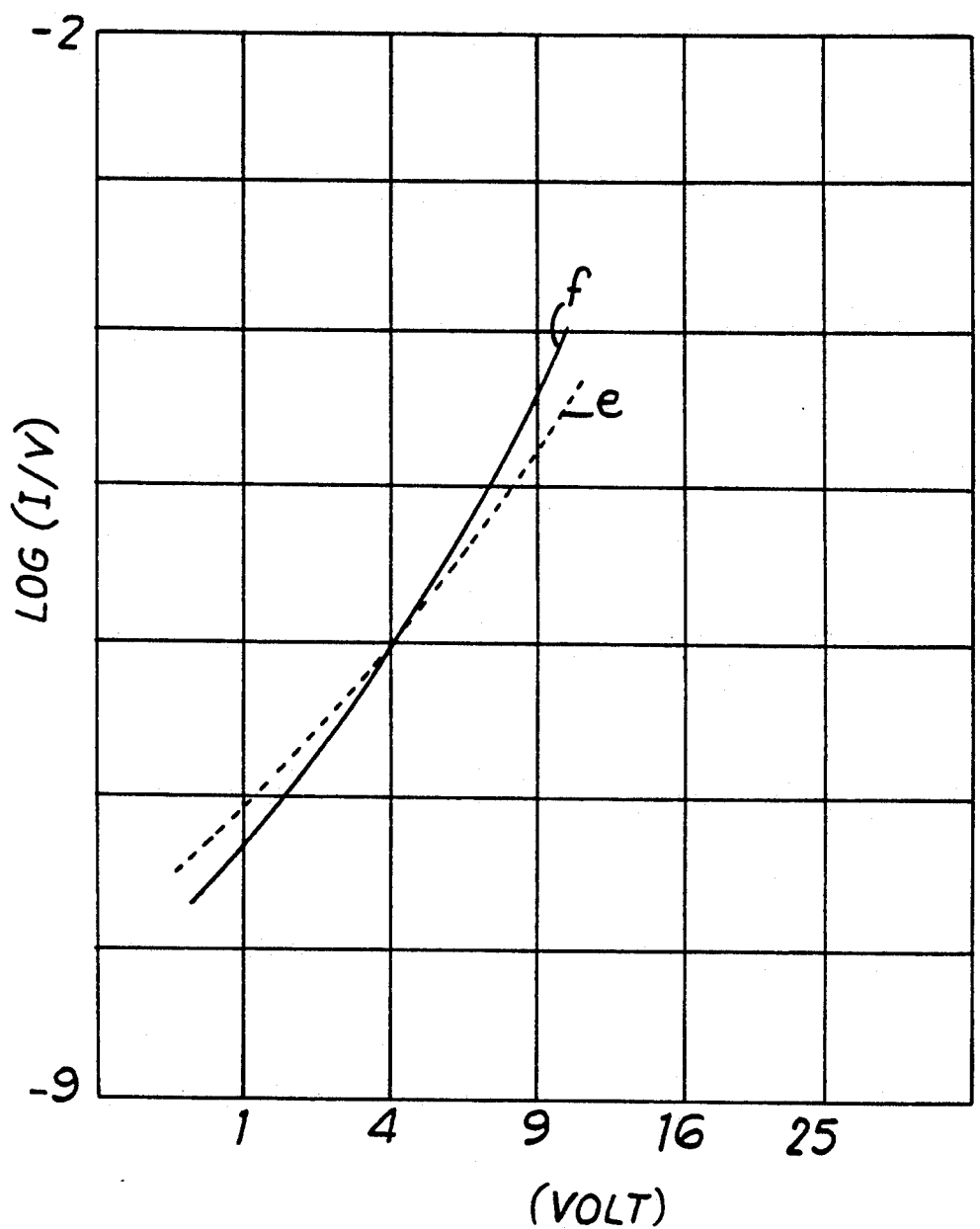
FIG. 18 is an I/V characteristic diagram of an MIM element prepared in accordance with Example 20.

The relationship between the logarithmic value of the I-V characteristic and the voltage applied to this switching element is shown in FIG. 18. Curves e and f depict when the first conductor is minus (−) and positive (+), respectively. FIG. 18 shows that the conductivity rises non-linearly as the voltage is applied. In other words, the element has efficient switching performance because the resistance value changes three orders of magnitude between a high and low applied voltage, and so the effect of polarity on the characteristic is minimized.

EXAMPLE 21

An ITO (indium-tin oxide) film measuring 1,500 Å in thickness and provided with an electrode pattern of 50 μm in diameter was formed on a glass substrate by spattering.

An electrolytic polymerization solution containing 0.25 mol/l of pyrrole and 0.05 mol/l of sodium hydroxide was prepared. A platinum plate was used as a counter electrode and a silver-silver chloride electrode as a reference electrode. The electrolytic polymerization solution, with the aforementioned ITO-deposited glass substrate immersed therein, was subjected to electrolytic polymerization at a constant potential of +1.3 V for 30 minutes to superpose a polypyrrole film 2,000 Å in thickness onto the ITO film.

The composite element was washed with purified water and ethanol and dried gently with Ar gas. An ITO film was formed in a thickness of 500 Å on the entire surface of the glass substrate by spattering. The evaluation of the resulting I-V characteristics showed that satisfactory and stable switching characteristics were obtained without the additional ion removal step.

EXAMPLE 22

An ITO (indium-tin oxide) film was formed on a glass substrate in column electrode patterns. Subsequently, an electrolytic polymer polypyrrole film was formed on the ITO column electrodes in manner similar to Example 21. An ITO film was formed in a thickness of 500 Å on the entire surface of the glass substrate by spattering. This ITO film was patterned by photolitho-etching into the shape of the element shown in FIGS. 3 and 4 to produce an element having an ITO/polypyrrole/ITO structure at the designated position on the multiple column electrodes. The laminating structure portion of the element was 25 μm × 15 μm in area.

Figure 19:
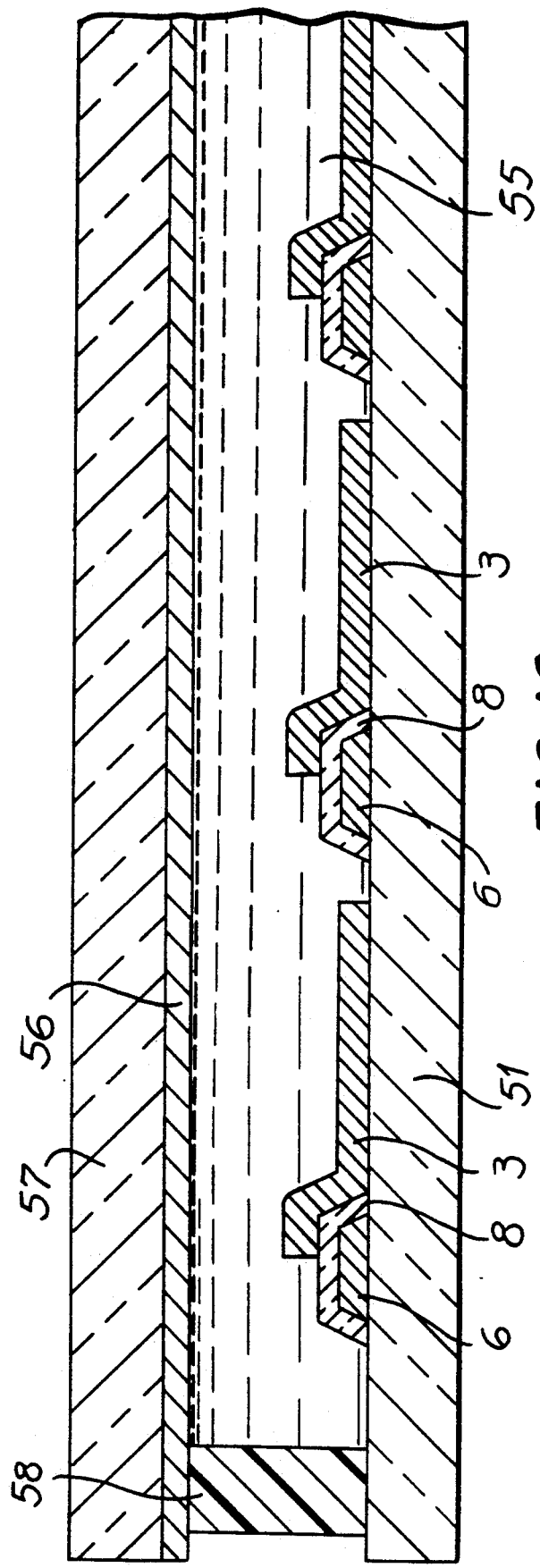
FIG. 19 is a cross-sectional view of a liquid crystal panel including a bidirectional nonlinear resistor in accordance with the invention.

A second glass substrate was prepared as an opposed substrate by depositing multiple rows of ITO electrodes thereon. The first and second substrates were securely attached by prescribed manufacturing methods to form a liquid crystal panel, thereby producing an active matrix liquid crystal panel. The structure of the panel is shown in FIG. 19. In FIG. 19, the first and second glass substrates are designated as 51 and 57, respectively, with the ITO electrodes on second glass substrate 57 designated as 56. Liquid crystal material 55 is positioned between substrates 51 and 57 and the panel is secured with sealant 58.

At this point, the area of the switching element was 200 μm × 200 μm. To determine contrast, the prepared liquid crystal panel was driven with the same drive circuit as used for a conventional MIM panel having the same picture element area but an MIM element 5 μm × 4 μm in area. It was found that the panel produced herein had better contrast than the conventional panel. It is thus seen that the switching element in accordance with the invention can be larger than in a conventional MIM panel which retaining good switching performance.

EXAMPLE 23

The electrolytic polymer film made in accordance with Example 22 was formed into plural column electrodes on a glass substrate in the manner described in Example 22. This in turn was made into an active matrix liquid crystal panel and compared with a conventional active matrix liquid crystal panel. It was found that the panel produced herein had better contrast than the conventional panel.

Specific advantages of the active matrix liquid crystal panel of this invention as described include a picture quality comparable to that of the TFT element, and a bidirectional nonlinear resistor which may be produced inexpensively in high yield.

It will thus be seen that the objects set forth above, among those made apparent from the preceding description, are efficiently attained, and certain changes may be made in the above construction and steps without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A method for preparation of an active matrix substrate, comprising:
    a) forming a first electrode in a designated pattern on a first transparent substrate;
    b) depositing a highly insulating electrolytic polymer film on the electrode by electrolytic polymerization of an electrolytic solution; and
    c) selectively depositing a transparent electrode on the first substrate with at least a portion thereof opposed to a portion of the first electrode to form a conductor-insulator-conductor structure which functions as a nonlinear resistor.

2. The method of claim 1, wherein the electrolytic polymerization of step b) includes:

immersing the first transparent substrate with the first electrode in the electrolytic solution including a solvent, alkali hydroxide, and an organic compound selected from the group consisting of pyrrole, a derivative of pyrrole, phenol, and a derivative of phenol; and applying a voltage to the electrolytic solution to polymerize the organic compound and cause a film of the polymerized organic compound to be deposited on the electrode.

3. The method of claim 2, wherein the alkali hydroxide is selected from the group consisting of NaOH, KOH, or LiOH.

4. The method of claim 2, wherein the solvent of the electrolytic solution includes water, alcohol, or a mixture thereof.

5. The method of claim 2, wherein the electrolytic solution further includes a pH buffering solution.

6. The method of claim 5, wherein the pH of the electrolyte solution is between about 10 and about 13.

7. A method for preparation of an electro-optical cell for an electro-optical display device comprising:

a) selectively depositing a first conductive wire on a first transparent substrate;

b) forming a highly insulating electrolytic polymer film on at least a portion of the first conductive wire by electrolytic polymerization of an electrolytic solution;

c) forming a first transparent electrode on the entire surface of the first substrate;

d) shaping the first transparent electrode into a designated pattern to form conductor-insulator-conductor nonlinear resistors used as switching elements for driving an electro-optical display device; and e) attaching a second transparent substrate having a second transparent electrode selectively deposited thereon for cooperating with the first transparent electrode on the first transparent substrate with a space therebetween.

8. The method of claim 7, wherein the electrolytic polymerization of step b) includes:

immersing the first conductive wire and first transparent substrate in the electrolytic solution including a solvent, alkali hydroxide, and an organic compound selected from the group consisting of pyrrole, a derivative of pyrrole, phenol, and a derivative of phenol; and applying a voltage to the electrolytic solution to polymerize the organic compound and cause a film of the polymerized organic compound to be deposited on at least a portion of the first conductive wire.

9. A method for preparation of an active matrix substrate comprising:

a) forming a first electrode of a designated pattern on a first transparent substrate;

b) depositing a highly insulating electrolytic polymer film on the electrode by electrolytic polymerization of an electrolytic solution;

c) selectively forming a plurality of second conductors in the designated pattern on the insulting polymer film to form a conductor-insulator-conductor structure which functions as a nonlinear resistor; and d) selectively depositing a picture element on or adjacent to each second conductor.

10. The method of claim 9, wherein the electrolytic polymerization of step b) includes:

immersing the first electrode and first transparent substrate in the electrolytic solution including alkali hydroxide and an organic compound selected from the group consisting of pyrrole, a derivative of pyrrole, phenol, and a derivative of phenol; and applying a voltage to the electrolytic solution to polymerize the organic compound and cause a film of the polymerized organic compound to be deposited on the electrode.

11. The method of claim 9, wherein the conductor is made of the same material as the first electrode.

12. The method of claim 9, wherein the conductor is made of material different from the first electrode.

13. The method of claim 9, wherein steps a) and d) are simultaneously carried out.

14. A method for preparation of an electro-optical cell for an electro-optical display device comprising:

a) forming a first electrode in a pattern of parallel rows on a first transparent substrate;

b) depositing a highly insulating electrolytic polymer film on the electrode by electrolytic polymerization of an electrolytic solution;

c) selectively depositing a plurality of second conductors in the designated pattern on the insulating polymer films to form a conductor-insulator-conductor structure which functions as a nonlinear resistor;

d) selectively depositing a picture element on or adjacent to the second conductors; and e) attaching a second transparent substrate having a second transparent electrode selectively deposited thereon for cooperating with the first transparent electrode on the first transparent substrate with a space therebetween.

15. The method of claim 14, wherein the electrolytic polymerization of step b) includes:

immersing the first electrode and first transparent substrate in the electrolytic solution including alkali hydroxide and an organic compound selected from the group consisting of pyrrole, a derivative of pyrrole, phenol, and a derivative of phenol; and applying a voltage to the electrolytic solution to polymerize the organic compound and cause a film of the polymerized organic compound to be deposited on the electrode.

16. A method for preparation of a active matrix substrate comprising:

a) forming a first electrode in a designated pattern of parallel rows on a first transparent substrate;

b) depositing a transparent insulating film on the entire surface of the transparent substrate;

c) forming a contact hole in the insulating film to the electrode;

d) depositing an electrolytic polymer film through the contact hole on the electrode by electrolytic polymerization of an electrolytic solution;

e) selectively depositing a second conductor in a designated pattern on the first transparent substrate with at least a portion thereof opposed to a portion of the first electrode to form a conductor-insulator-conductor structure which functions as a nonlinear resistor; and f) selectively depositing picture element electrodes on or adjacent to the second conductor.

17. The method of claim 16, wherein the electrolytic polymerization of step d) includes:
  immersing the first electrode, first transparent substrate and transparent insulating film in the electrolytic solution including alkali hydroxide and an organic compound selected from the group consisting of pyrrole, a derivative of pyrrole, phenol, and a derivative of phenol; and
  applying a voltage to the electrolytic solution to polymerize the organic compound and cause a film of the polymerized organic compound to be deposited through the contact hole on the electrode.

18. The method of claim 16, wherein the first electrodes and the display elements are simultaneously deposited.

19. The method of claim 16, wherein the second conductor is transparent and is also used as the picture element electrodes.

* * * * *